United States Patent
Khan et al.

(10) Patent No.: US 6,939,770 B1
(45) Date of Patent: Sep. 6, 2005

(54) METHOD OF FABRICATING SEMICONDUCTOR DEVICE HAVING TRIPLE LDD STRUCTURE AND LOWER GATE RESISTANCE FORMED WITH A SINGLE IMPLANT PROCESS

(75) Inventors: Imran Khan, Santa Clara, CA (US); Jianshi Wang, San Jose, CA (US); Yue-Song He, San Jose, CA (US); Jun Kang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/618,514

(22) Filed: Jul. 11, 2003

(51) Int. Cl.[7] ............................................. H01L 21/336
(52) U.S. Cl. ....................................... 438/301; 438/303
(58) Field of Search ........................ 438/197, 230–232, 438/301–307; 257/336, 337, 344, 408, E29.278, 257/E21.435, 549, E29.012

(56) References Cited

U.S. PATENT DOCUMENTS

| | | | | |
|---|---|---|---|---|
| 5,102,815 | A | * | 4/1992 | Sanchez ...................... 438/305 |
| 5,719,425 | A | * | 2/1998 | Akram et al. ................ 257/344 |
| 5,920,783 | A | * | 7/1999 | Tseng et al. ................. 438/305 |
| 5,929,483 | A | * | 7/1999 | Kim et al. ................... 257/336 |
| 6,043,545 | A | * | 3/2000 | Tseng et al. ................. 257/408 |
| 6,156,598 | A | * | 12/2000 | Zhou et al. ................. 438/231 |
| 6,818,519 | B2 | * | 11/2004 | Fang et al. ................. 438/301 |
| 2002/0158289 | A1 | * | 10/2002 | Kim ........................... 257/344 |

* cited by examiner

*Primary Examiner*—George Fourson
*Assistant Examiner*—Brook Kebede

(57) ABSTRACT

A method of fabricating a semiconductor device having a triple LDD (lateral diffused dopants) structure is disclosed. This fabrication method requires a single implant process, leading to reduction in fabrication costs and fabrication time. Moreover, this fabrication method increases the surface area of the gate structure of the semiconductor device that is available for silicide to be formed, leading to lower gate resistance.

18 Claims, 6 Drawing Sheets

METHOD OF FABRICATING SEMICONDUCTOR DEVICE HAVING TRIPLE LDD STRUCTURE AND LOWER GATE RESISTANCE FORMED WITH A SINGLE IMPLANT PROCESS

BACKGROUND OF THE INVENTION

1. Field of the Invention

The present invention generally relates to semiconductor fabrication processes. More particularly, the present invention relates to the field of fabricating semiconductor devices having a triple LDD (lateral diffused dopants) structure.

2. Related Art

Semiconductor fabrication processes have made possible the fabrication of advanced integrated circuits on a semiconductor wafer. These semiconductor fabrication processes are complex, requiring extensive control and care to avoid fabricating defective integrated circuits.

Due to the need for high speed and low-voltage, advanced structures have been developed for semiconductor devices such as MOSFETs (metal oxide semiconductor field effect transistor). One such structure is the triple LDD (lateral diffused dopants) structure for the source and drain of the MOSFET. In particular, the triple LDD structure provides a solution to short channel effects.

FIGS. 1A–1F illustrate a conventional method of fabricating a semiconductor device having a triple LDD (lateral diffused dopants) structure. Here, the semiconductor device is a MOSFET 100. As shown in FIG. 1A, a gate structure 10 is formed on the surface of a semiconductor substrate 40. Then, a first implant process is performed to implant a dopant into the semiconductor substrate 40 to form a source 20 and a drain 30. Here, the source 20 and the drain 30 have a single LDD structure.

Moreover, FIG. 1B shows that a first spacer 50 is formed adjacent to the vertical surfaces of the gate structure 10. Furthermore, a second implant process is performed to implant a dopant into the semiconductor substrate 40 to further define the source 20 and the drain 30, as depicted in FIG. 1C. Here, the source 20 and the drain 30 have a double LDD structure.

Additionally, FIG. 1D shows that a second spacer 60 is formed adjacent to the vertical surfaces of the gate structure 10. A third implant process is performed to implant a dopant into the semiconductor substrate 40 to further define the source 20 and the drain 30, as depicted in FIG. 1E. Here, the source 20 and the drain 30 finally have the triple LDD structure.

Furthermore, a silicidation process is performed to form a silicide 70 on the horizontal surface of the gate structure 10 and on the surface of the source 10 and the drain 10 as shown in FIG. 1F, whereas the silicide 70 is used as a contact.

As illustrated in FIGS. 1A–1F, this conventional fabrication method requires three separate implant processes. Each implant process is costly and time consuming. Moreover, the first and second spacers 50 and 60 cover portions of the surface area of the gate structure 10, reducing the surface area of the gate structure 10 that is available for the silicide 70 to be formed. This can lead to higher gate resistance as the width of the gate structure 10 is decreased in advanced semiconductor fabrication applications.

SUMMARY OF THE INVENTION

A method of fabricating a semiconductor device having a triple LDD (lateral diffused dopants) structure is disclosed. This fabrication method requires a single implant process, leading to reduction in fabrication costs and fabrication time. Moreover, this fabrication method increases the surface area of the gate structure of the semiconductor device that is available for silicide to be formed, leading to lower gate resistance. In an embodiment, the method of fabricating the semiconductor device having the triple LDD (lateral diffused dopants) structure comprises forming a gate structure on a surface of a semiconductor substrate. The gate structure includes a first vertical surface and a second vertical surface. Then, a first spacer adjacent to the first vertical surface and a second spacer adjacent to the second vertical surface are formed. The first spacer has a first thickness and a second thickness that is greater than the first thickness and that abuts the first vertical surface. The second spacer has a third thickness and a fourth thickness that is greater than the third thickness and that abuts the second vertical surface. Moreover, a single implant process is performed to form the triple LDD structure for a drain and a source of the semiconductor device in the semiconductor substrate.

These and other advantages of the present invention will no doubt become apparent to those of ordinary skill in the art after having read the following detailed description of the preferred embodiments, which are illustrated in the drawing figures.

BRIEF DESCRIPTION OF THE DRAWINGS

The accompanying drawings, which are incorporated in and form a part of this specification, illustrate embodiments of the invention and, together with the description, serve to explain the principles of the present invention.

The drawings referred to in this description should not be understood as being drawn to scale except if specifically noted.

DETAILED DESCRIPTION OF THE INVENTION

Reference will now be made in detail to embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention.

A method of fabricating a semiconductor device having a triple LDD (lateral diffused dopants) structure is disclosed. This fabrication method requires a single implant process, leading to reduction in fabrication costs and fabrication time. Moreover, this fabrication method increases the surface area of the gate structure of the semiconductor device that is available for silicide to be formed, leading to lower gate resistance.

FIGS. 2A–2H illustrate a method of fabricating a semiconductor device having a triple LDD (lateral diffused dopants) structure in accordance with an embodiment of the present invention. In an embodiment, the semiconductor device is a MOSFET (metal oxide semiconductor field effect transistor) 200.

Figure 1A:
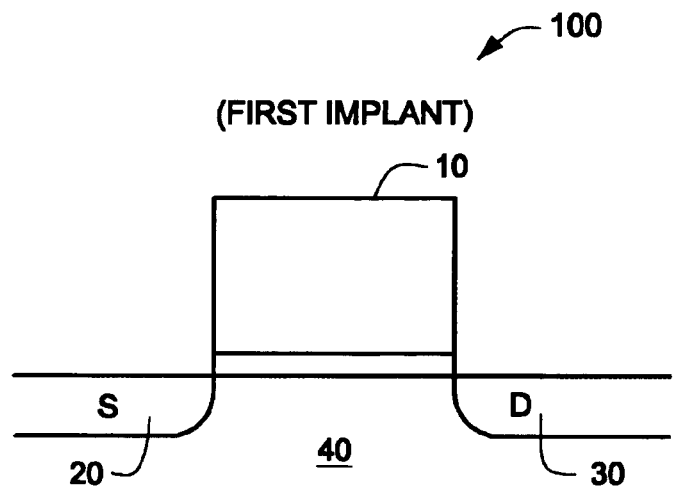
FIGS. 1A–1F illustrate a conventional method of fabricating a semiconductor device having a triple LDD (lateral diffused dopants) structure.
Figure 1B:
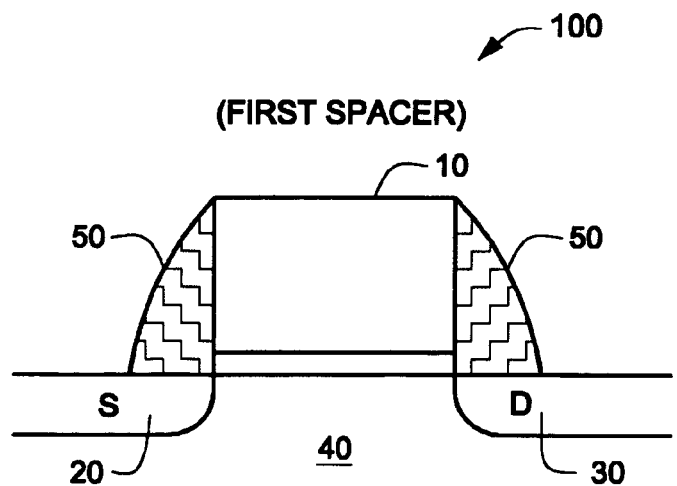
Figure 1C:
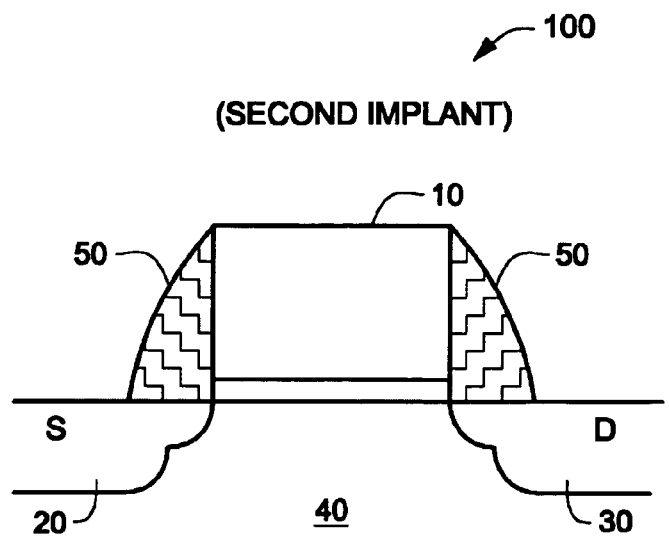
Figure 1D:
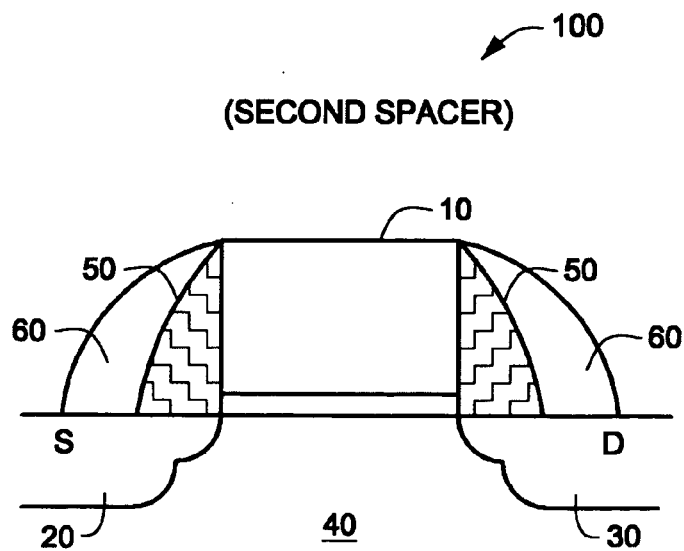
Figure 1E:
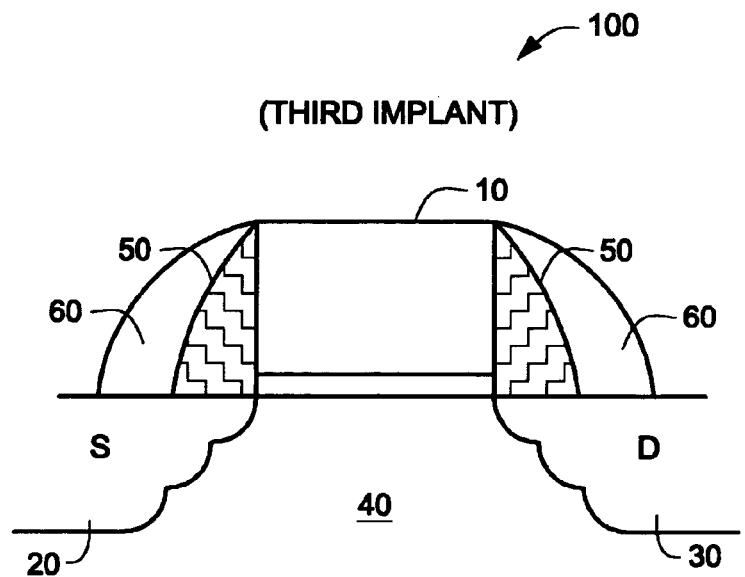
Figure 1F:
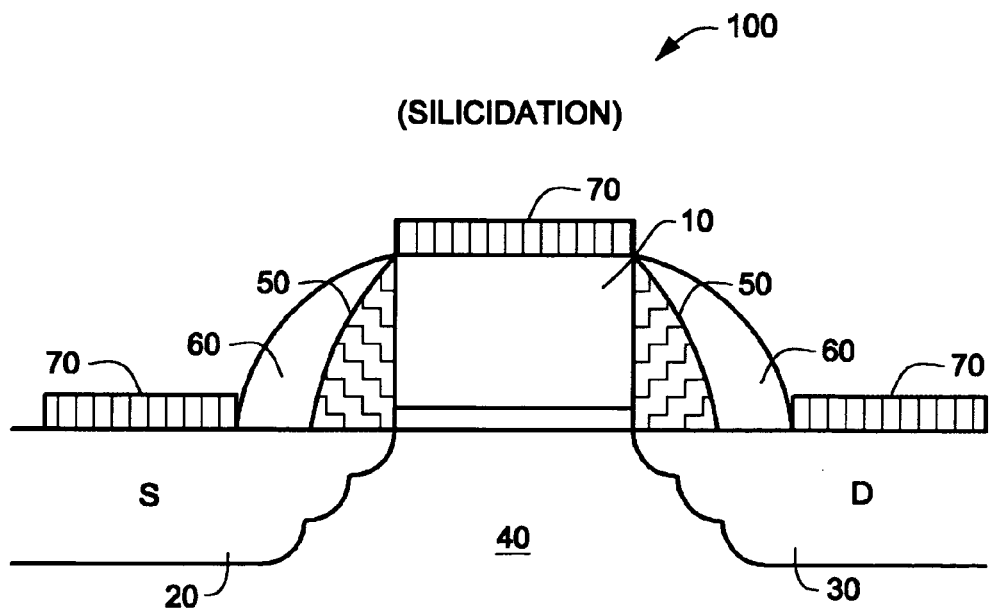
Figure 2A:
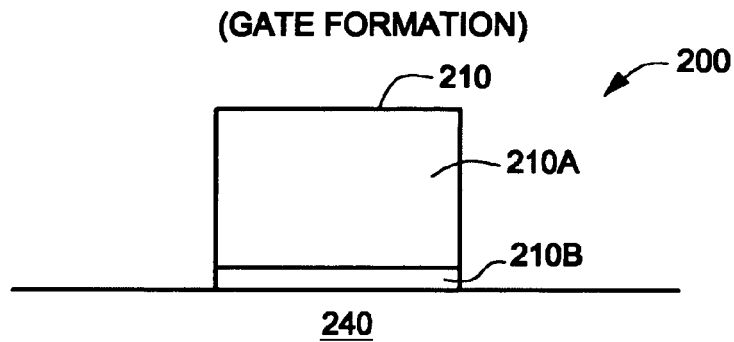
FIGS. 2A–2H illustrate a method of fabricating a semiconductor device having a triple LDD (lateral diffused dopants) structure in accordance with an embodiment of the present invention.
Figure 2B:
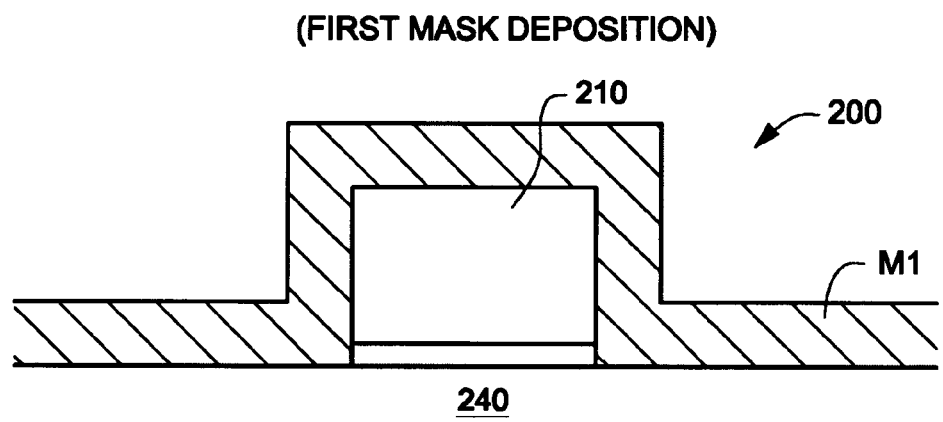

As depicted in FIG. 2A, a gate structure 210 is formed on the surface of a semiconductor substrate 240. In an embodiment, the gate structure 210 includes a gate 210A comprised of polysilicon and a gate oxide 210B comprised of silicon dioxide. Furthermore, a first mask M1 is deposited on the surface of the semiconductor substrate 240 and on the gate structure 210, as shown in FIG. 2B. The first mask M1 can be deposited using any deposition process such as chemical vapor deposition.

Figure 2C:
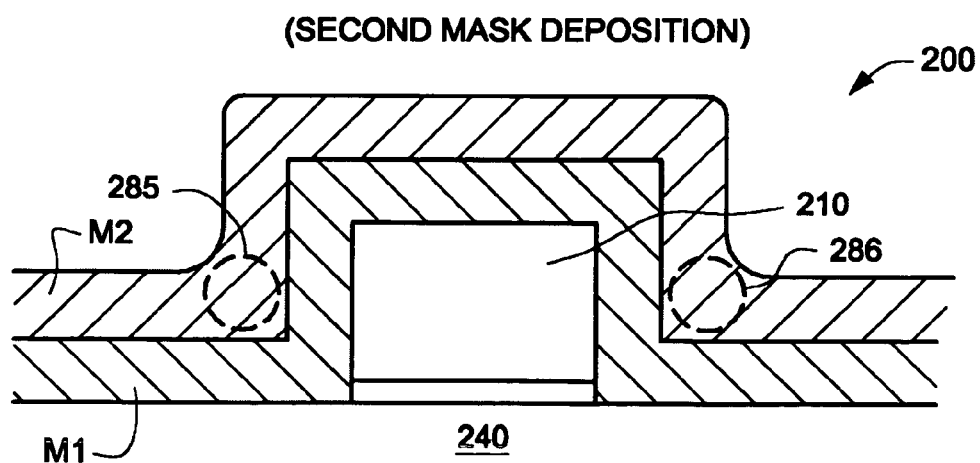

A second mask M2 is deposited on the surface of the semiconductor substrate 240 and on the gate structure 210, as shown in FIG. 2C. The second mask M2 can be deposited using any deposition process such as chemical vapor deposition.

Figure 2D:
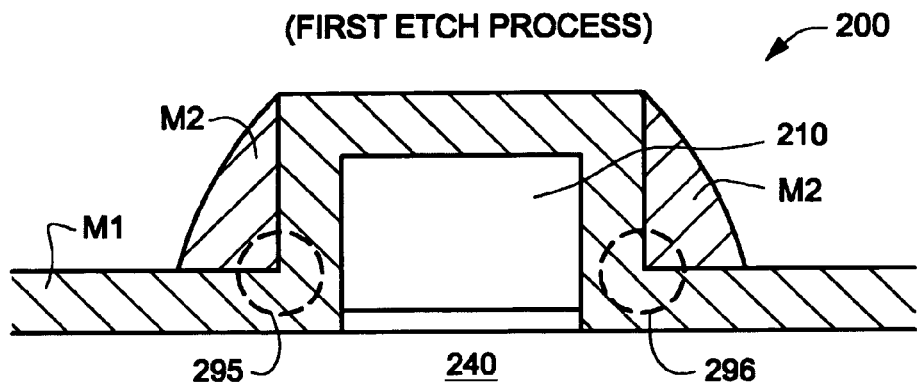

As shown in FIG. 2D, a first plasma etch process is performed to remove substantially the second mask M2, whereas the first plasma etch process is an anisotropic etch. The first plasma etch process uses a first plasma that has a first etch rate with respect to the first mask M1 and a second etch rate with respect to the second mask M2. Here, the second etch rate is substantially greater than the first etch rate, enabling substantial removal of the second mask M2 without removing a significant portion of the first mask M1. Since the second mask M2 is thicker at the corners 285 and 286 (of FIG. 2C) and since the first plasma etch process is an anisotropic etch, the portion of the second mask M2 that remains after performing the first plasma etch process is located in the corners 285 and 286 (of FIG. 2C).

Figure 2E:
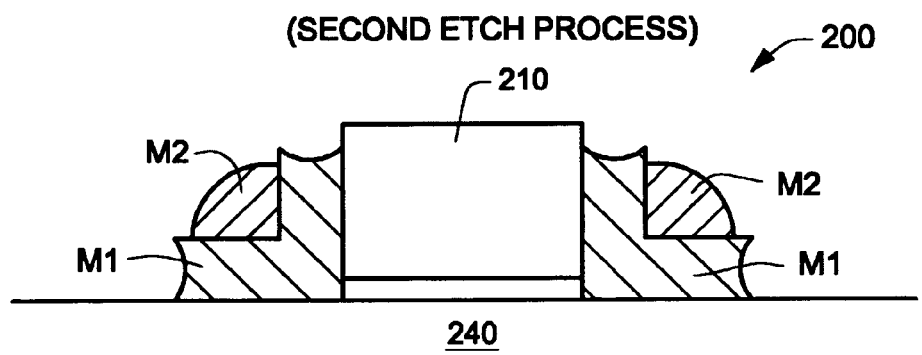

Furthermore, a second plasma etch process is performed to remove substantially the first mask M1, as depicted in FIG. 2E. The second plasma etch process is an anisotropic etch. The second plasma etch process uses a second plasma that has a first etch rate with respect to the first mask M1, a second etch rate with respect to the second mask M2, and a third etch rate with respect to the gate structure 210. Here, the first etch rate is substantially greater than the second etch rate and the third etch rate, enabling substantial removal of the first mask M1 without completely removing the second mask M2 and without removing a significant portion of the gate structure 210. Since the second mask M2 covers the first mask M1 at the corners 295 and 296 (of FIG. 2D), since the second plasma etch process is an anisotropic etch, and since first etch rate of the second plasma etch process is substantially greater than the second etch rate of the second plasma etch process and the third etch rate of the second plasma etch process, the portion of the first mask M1 that remains after performing the second plasma etch process is located in the corners 295 and 986 (of FIG. 2D).

Figure 2F:
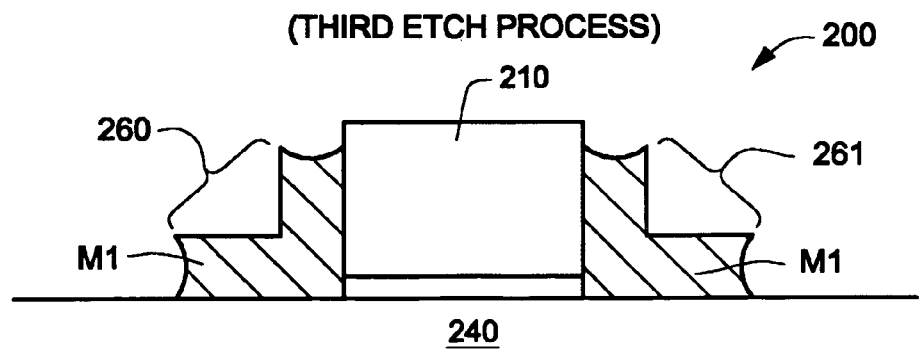

Moreover, a third plasma etch process is performed to remove completely the second mask M2, as depicted in FIG. 2F. The third plasma etch process uses a third plasma that has a first etch rate with respect to the first mask M1, a second etch rate with respect to the second mask M2, and a third etch rate with respect to the gate structure 210. Here, the second etch rate is substantially greater than the first etch rate and the third etch rate, enabling complete removal of the second mask M2 without completely removing the first mask M1 and without removing a significant portion of the gate structure 210. The remaining portions of the first mask M1 form and define a first spacer 260 and a second spacer 261.

The first spacer 260 is formed adjacent to a first vertical surface of the gate structure 210. The second spacer 261 is formed adjacent to a second vertical surface of the gate structure 210. The first spacer 260 has a first thickness and a second thickness that is greater than the first thickness and that abuts the first vertical surface of the gate structure 210. Additionally, the second spacer 261 has a third thickness and a fourth thickness that is greater than the third thickness and that abuts the second vertical surface of the gate structure 210.

In an embodiment, the first mask M1 is silicon nitride while the second mask M2 is silicon dioxide. It should be understood that the first mask M1 and the second mask M2 can be other materials.

Figure 2G:
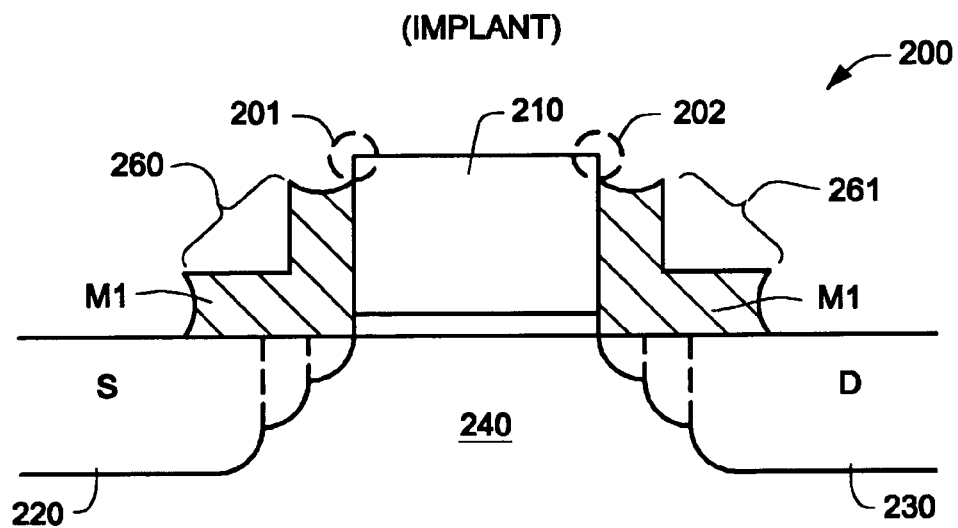

As depicted in FIG. 2G, a single implant process is performed to implant a dopant into the semiconductor substrate 240 to form the triple LDD structure for the source 220 and the drain 230 of the MOSFET 200. In an embodiment, the implant process is an ion implant process. The multiple thicknesses of the first spacer 260 and the second spacer 261 control the dopant penetration into the semiconductor substrate 240, providing the triple LDD structure for the source 220 and drain 230 of the MOSFET 200. During the implant process, the thickest portions of the first and second spacers 260 and 261 severely limit the dopant penetration into the semiconductor substrate 240 while the other portions of the first and second spacers 260 and 261 less severely limit the dopant penetration into the semiconductor substrate 240. The greatest penetration into the semiconductor substrate 240 is achieved where there is no spacer or gate structure 210 on the surface of the semiconductor substrate 240. Since a single implant process is performed, reduction in fabrication costs and fabrication time are achieved.

In an n-type MOSFET, the source 220 and drain 230 are doped with an n-type dopant. In a p-type MOSFET, the source 220 and drain 230 are doped with a p-type dopant.

Moreover, FIG. 2G shows that an upper portion 201 of the first vertical surface of the gate structure 210 and an upper portion 202 of the second vertical surface of the gate structure 210 are available for formation of a silicide during a silicidation process, increasing the surface area on the gate structure 210 for the silicide. This increased surface area on the gate structure 210 for the silicide leads to a lower gate resistance even if the width of the gate structure 210 is reduced.

Figure 2H:
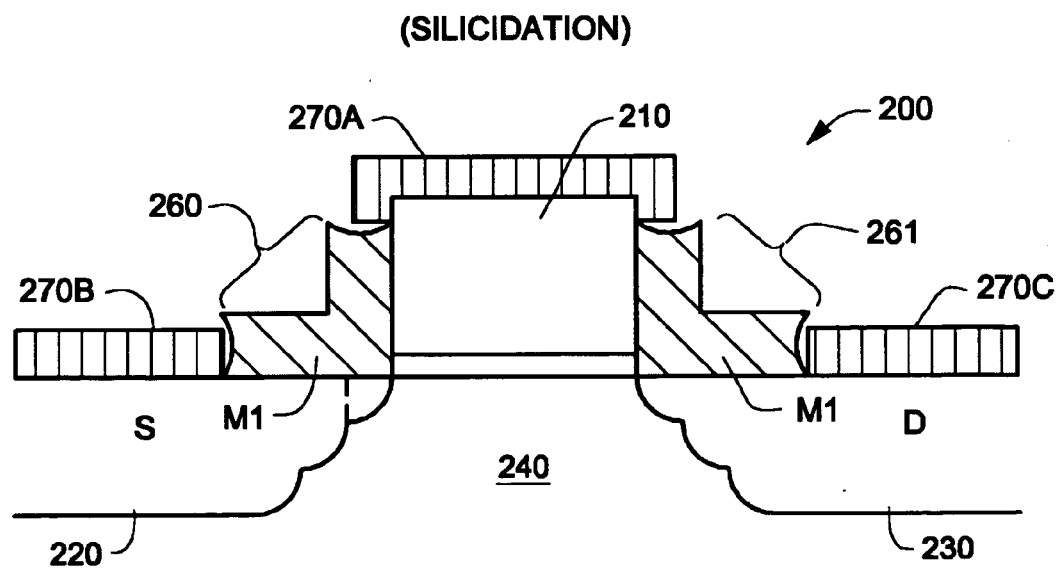

Furthermore, a silicidation process is performed as shown in FIG. 2H. A metal such as cobalt, nickel, aluminum, or titanium is utilized in the silicidation process. The silicidation process causes the formation of a first silicide 270B on the source 220 and the formation of a second silicide 270C on the drain 230, whereas the first silicide 270B and the second silicide 270C act as contacts. Moreover, the silicidation process causes formation of a third silicide 270A on the horizontal surface of the gate structure 210, on an upper portion 201 (FIG. 2G) of the first vertical surface of the gate structure 210, and on an upper portion 202 (FIG. 2G) of the second vertical surface of the gate structure 210.

The MOSFET 200 exhibits a lower gate resistance compared to the MOSFET 100 of the prior art since the MOSFET 200 has a greater surface area for supporting silicidation. This provides improved performance relative to the MOSFET 100 of the prior art.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method of fabricating a semiconductor device having a triple LDD (lateral diffused dopants) structure, comprising:

forming a gate structure on a surface of a semiconductor substrate, wherein said gate structure includes a first vertical surface and a second vertical surface;

forming a first spacer adjacent to said first vertical surface and a second spacer adjacent to said second vertical surface, wherein said first spacer has a first thickness and a second thickness that is greater than said first thickness and that abuts said first vertical surface, and wherein said second spacer has a third thickness and a fourth thickness that is greater than said third thickness and that abuts said second vertical surface, wherein said step of forming said first and second spacers comprises:

depositing a first mask on said surface and said gate structure;

depositing a second mask on said surface and said gate structure;

performing a first plasma etch process to remove substantially said second mask;

performing a second plasma etch process to remove substantially said first mask; and performing a third plasma etch process to remove completely said second mask such that a remaining portion of said first mask defines said first and second spacers; and performing a single implant process to form said triple LDD structure for a drain and a source of said semiconductor device in said semiconductor substrate.

2. The method as recited in claim 1 further comprising:
performing a silicidation process such that a silicide is formed on a horizontal surface of said gate structure, a first upper portion of said first vertical surface, and a second upper portion of said second vertical surface.

3. The method as recited in claim 1 wherein said first plasma etch process uses a first plasma that has a first etch rate with respect to said first mask and a second etch rate with respect to said second mask, and wherein said second etch rate is substantially greater than said first etch rate.

4. The method as recited in claim 1 wherein said second plasma etch process uses a second plasma that has a first etch rate with respect to said first mask, a second etch rate with respect to said second mask, and a third etch rate with respect to said gate structure, and wherein said first etch rate is substantially greater than said second etch rate and said third etch rate.

5. The method as recited in claim 1 wherein said third plasma etch process uses a third plasma that has a first etch rate with respect to said first mask, a second etch rate with respect to said second mask, and a third etch rate with respect to said gate structure, and wherein said second etch rate is substantially greater than said first etch rate and said third etch rate.

6. The method as recited in claim 1 wherein said first mask is silicon nitride.

7. The method as recited in claim 1 wherein said second mask is silicon dioxide.

8. The method as recited in claim 1 wherein said single implant process is an ion implant process.

9. The method as recited in claim 1 wherein said semiconductor device is a MOSFET (metal oxide semiconductor field effect transistor).

10. A method of fabricating a semiconductor device having a triple LDD (lateral diffused dopants) structure, comprising:

forming a gate structure on a surface of a semiconductor substrate, wherein said gate structure includes a first vertical surface and a second vertical surface;

depositing a first mask on said surface and said gate structure;

depositing a second mask on said surface and said gate structure;

performing a first plasma etch process to remove substantially said second mask;

performing a second plasma etch process to remove substantially said first mask;

performing a third plasma etch process to remove completely said second mask such that a remaining portion of said first mask defines a first spacer adjacent to said first vertical surface and a second spacer adjacent to said second vertical surface, wherein said first spacer has a first thickness and a second thickness that is greater than said first thickness and that abuts said first vertical surface, and wherein said second spacer has a third thickness and a fourth thickness that is greater than said third thickness and that abuts said second vertical surface; and performing an implant process to form said triple LDD structure for a drain and a source of said semiconductor device in said semiconductor substrate.

11. The method as recited in claim 10 further comprising:
performing a silicidation process such that a suicide is formed on a horizontal surface of said gate structure, a first upper portion of said first vertical surface, and a second upper portion of said second vertical surface.

12. The method as recited in claim 10 wherein said first plasma etch process uses a first plasma that has a first etch rate with respect to said first mask and a second etch rate with respect to said second mask, and wherein said second etch rate is substantially greater than said first etch rate.

13. The method as recited in claim 10 wherein said second plasma etch process uses a second plasma that has a first etch rate with respect to said first mask, a second etch rate with respect to said second mask, and a third etch rate with respect to said gate structure, and wherein said first etch rate is substantially greater than said second etch rate and said third etch rate.

14. The method as recited in claim 10 wherein said third plasma etch process uses a third plasma that has a first etch rate with respect to said first mask, a second etch rate with respect to said second mask, and a third etch rate with respect to said gate structure, and wherein said second etch rate is substantially greater than said first etch rate and said third etch rate.

15. The method as recited in claim 10 wherein said first mask is silicon nitride.

16. The method as recited in claim 10 wherein said second mask is silicon dioxide.

17. The method as recited in claim 10 wherein said implant process is an ion implant process.

18. The method as recited in claim 10 wherein said semiconductor device is a MOSFET (metal oxide semiconductor field effect transistor).

* * * * *